(12) United States Patent  (10) Patent No.: US 8,552,300 B2
Kozato  (45) Date of Patent: Oct. 8, 2013

(54) PRINTED BOARD FIXING APPARATUS

(75) Inventor: Atsushi Kozato, Tokyo (JP)

(73) Assignee: NEC Corporation, Tokyo (JP)

(*) Notice: Subject to any disclaimer, the term of this patent is extended or adjusted under 35 U.S.C. 154(b) by 36 days.

(21) Appl. No.: 13/223,824

(22) Filed: Sep. 1, 2011

(65) Prior Publication Data

US 2012/0069539 A1 Mar. 22, 2012

(30) Foreign Application Priority Data

Sep. 16, 2010 (JP) ................... 2010-207934

(51) Int. Cl.
*H05K 1/00* (2006.01)
(52) U.S. Cl.
USPC ............... 174/254; 361/785; 361/804
(58) Field of Classification Search
USPC .......... 174/254, 255, 260, 261, 267; 361/785, 361/804
See application file for complete search history.

(56) References Cited

U.S. PATENT DOCUMENTS

| | | | |
|---|---|---|---|
| 6,614,664 B2* | 9/2003 | Lee | 361/784 |
| 2006/0082985 A1* | 4/2006 | Naruse | 361/784 |
| 2009/0175015 A1* | 7/2009 | Mukouyama | 361/785 |

FOREIGN PATENT DOCUMENTS

| | | |
|---|---|---|
| JP | 10-308570 A | 11/1998 |
| JP | 2003264353 A | 9/2003 |
| JP | 2008270234 A | 11/2008 |
| JP | 2009164387 A | 7/2009 |

* cited by examiner

*Primary Examiner* — Timothy Thompson
*Assistant Examiner* — Andargie M Aychillhum

(57) ABSTRACT

To provide a printed board fixing device capable of reducing the thickness and size with a simple structure. The printed board fixing device includes a coupling member which two-folds a flex rigid printed board that includes one and the other rigid printed boards via a flexible part and mutually couples and fixes the one and the other boards. The length of the coupling member is set to be within a range of entire thickness including the one and the other rigid printed boards. The coupling member is provided at two points on the one and the other rigid printed boards.

4 Claims, 9 Drawing Sheets

PRINTED BOARD FIXING APPARATUS

CROSS-REFERENCE TO RELATED APPLICATION

This application is based upon and claims the benefit of priority from Japanese patent application No. 2010-207934, filed on Sep. 16, 2010, the disclosure of which is incorporated herein in its entirety by reference.

BACKGROUND OF THE INVENTION

1. Field of the Invention

The present invention relates to a printed board fixing device. More specifically, the present invention relates to a printed board fixing device which can fix a single flex rigid printed board in a folded state used in an information apparatus, an electronic apparatus, and the like.

2. Description of the Related Art

Recently, in small-type communication optical modules such as SFP and XFP as well as mobile terminal devices, more and more reduction in size as well as weight and increase in the number of functions are achieved in response to the needs of consumers.

Thus, the number of electronic components provided inside a small-type communication optical module, a mobile terminal device, and the like is increased. As a result, a board with a large area is required for mounting those electronic components.

Thus, there has been developed a type that is formed with two or more pieces of two-folded boards to increase the mount area in order to reduce the size of a casing of a small-type communication optical module, a mobile terminal device, or the like.

In that case, when the board is a flex rigid printed board, for example, a flexible part of the board exhibits flexibility. Therefore, it is necessary to fix it by using some kind of methods.

As a method for fixing a board such as a flex rigid printed board or the like, there are various known methods.

As an example, a mobile radio device having a spacer provided between two pieces of two-folded boards is known (see Japanese Unexamined Patent Publication 2003-264353 (Patent Document 1), for example).

The mobile radio device disclosed in Patent Document 1 keeps the space between the two boards by the spacer. Further, the tip of the flexible board is held by a connector main body and a cover.

As another example, a board fixing structure having a spacer provided between two pieces of two-folded boards, a board fixing spacer, and a board unit are known (see Japanese Unexamined Patent Publication 2008-270234 (Patent Document 2), for example).

In the board fixing structure, the board fixing spacer, and the board unit disclosed in Patent Document 2, the two boards are fixed by using the spacer, and the spacer part is fixed to the board by a clamping/fixing screw or the like.

Further, as another example, a printed board unit which holds two boards by a fixing member as well as the fixing member of the printed board unit are known (see Japanese Unexamined Patent Publication 2009-164387 (Patent Document 3), for example).

In the printed board unit and the fixing member of the printed board unit disclosed in Patent Document 3, the fixing member is formed with a first fixing part, a second fixing part, and a first middle fixing part. The fixing member is so structured that the space between the two boards can be changed through the use of the first middle fixing part of different lengths.

As still another example, there is known an inter-printed board connecting module which fixes two printed boards by utilizing a pin header and an attaching guide (see Japanese Unexamined Patent Publication Hei 10-308570 (Patent Document 4), for example).

The inter-printed board connecting module disclosed in Patent Document 4 is so structured that a fixing pin can be easily inserted into a pin hole of a connecter mounted to the boards by utilizing the attaching guide.

Further, other than the board fixing methods disclosed in each of cited Documents 1 to 4, boards are fixed in many cases by using a fixing device 50 constituted with fixing bolts 53 provided at two points as shown in FIG. 7 to FIG. 9.

That is, the fixing device 50 is placed between one board 22 out of two-folded boards and the other board 23 in parallel to each other of a printed board 20, and it is formed by including two fixing bolts 53 which connect and fix the one and the other boards 22 and 23 to each other as described above. And each of the boards 22 and 23 is two-folded by folding a board flexible part 21.

Further, each of the fixing bolts 53 is provided via a spacer 52 for keeping the space between each of the boards 22 and 23. The spacer 52 is formed by a round pipe made of a resin such as PP (polypropylene).

As shown in FIG. 8 and FIG. 9, each of the fixing bolts 53 is provided on both ends in the longitudinal direction of the one and the other boards 22 and 23, which are on a diagonal line of one end where the board flexible part 21 is provided in the width direction (lower right portion of FIG. 1) and the opposite-side end thereof.

Those bolts 53 are inserted from the other board 23 side towards the one board 22. Heads 53A thereof are extruded on the outer side of the other board 23, and nuts 53B are extruded on the outer side of the one board 22.

However, each of Patent Documents 1 to 4 uses the board fixing spacer, the connecter, and the like, so that the structure becomes complicated. Further, there are such issues that the end of the spacer becomes extruded to the outer circumference of the parallel boards and the required board area for mounting the components becomes reduced because of the spacer, the connecter, and the like.

Further, in the fixing device 50 shown in FIG. 7 to FIG. 9, the one and the other boards 22 and 23 are fixed by the fixing bolts 53. However, the heads 53A and the nuts 53B of the fixing bolts 53 are extruded towards the outer side of the one and the other boards 22 and 23, respectively, so that it is difficult to be formed thin because of the extruded parts. As a result, it becomes difficult to reduce the size.

It is therefore an exemplary object of the present invention to provide a printed board fixing device which is capable of reducing the thickness and size with a simple structure in order to overcome each of the above-described issues.

SUMMARY OF THE INVENTION

In order to achieve the foregoing exemplary object, the printed board fixing device according to an exemplary aspect of the invention is characterized as a printed board fixing device, comprising a coupling member which two-folds a flex rigid printed board including one and other rigid printed boards via a flexible part and mutually couples and fixes the one and the other boards, wherein length of the coupling member is set to be within a range of entire thickness including the one and the other rigid printed boards.

DETAILED DESCRIPTION OF THE PREFERRED EMBODIMENTS

Figure 1:
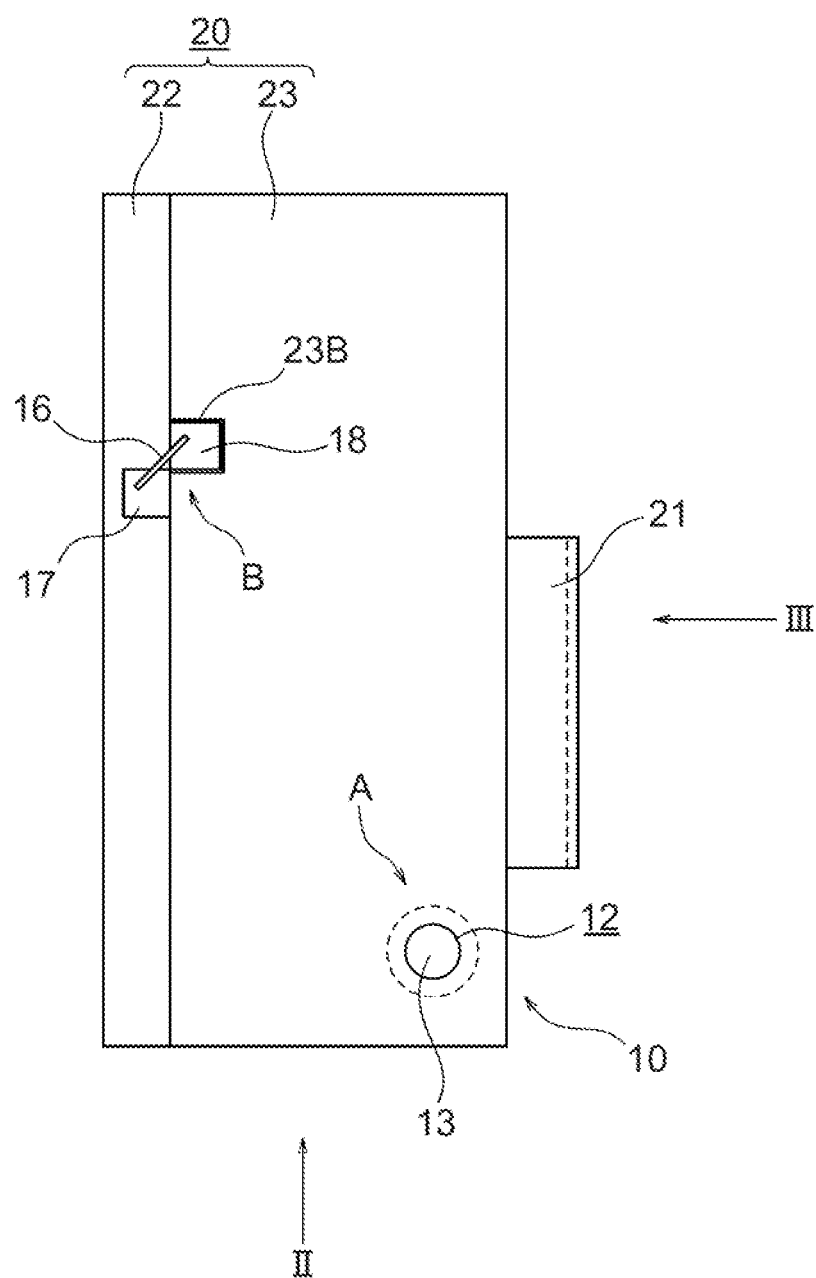
FIG. 1 is an overall plan view showing an exemplary embodiment of a printed board fixing device according to the present invention.

Hereinafter, an exemplary embodiment of a printed board fixing device according to the present invention will be described by referring to FIG. 1 to FIG. 4. In the exemplary embodiment, same reference numerals as those of the related technique are applied to the structures that are same as the members used in the fixing device 50 of the related technique.

A printed board fixing device (simply referred to as a fixing device hereinafter) 10 of the exemplary embodiment fixes a flex rigid printed board (simply referred to as a printed board hereinafter) 20 in a folded state used for small communication optical modules such as SFP (Small Form Factor Pluggable), XFP (10 Gigabit Small Form Factor Pluggable), etc.

Figure 2:
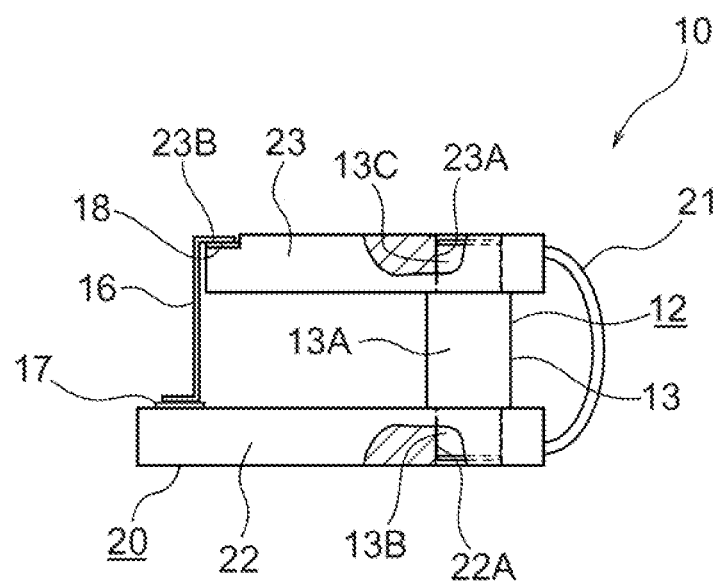
FIG. 2 is a view taken along an arrow II of FIG. 1.
Figure 3:
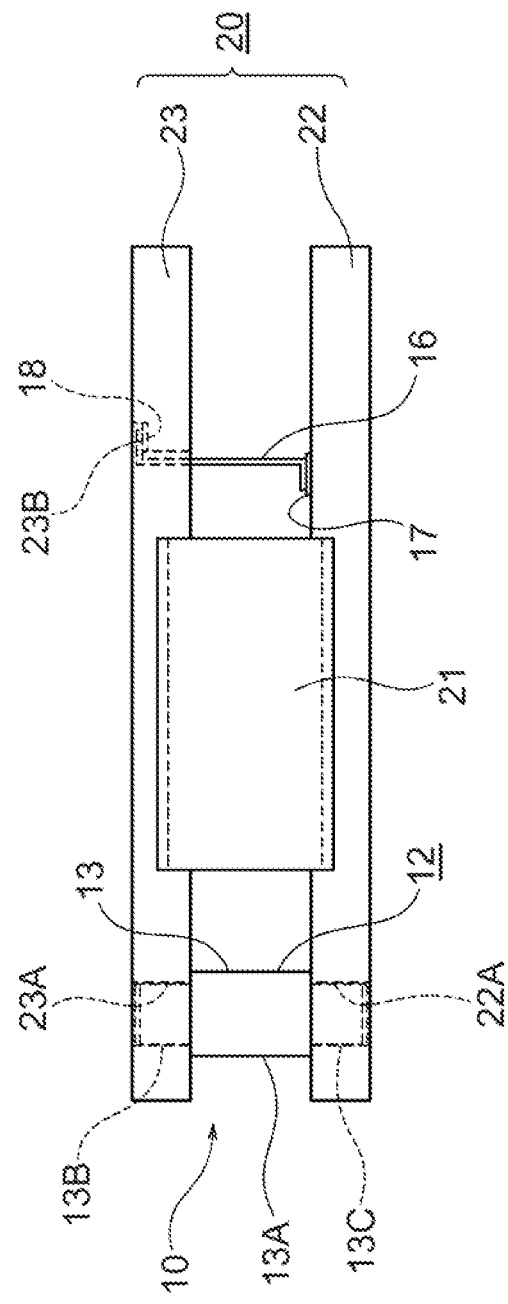
FIG. 3 is a view taken along an arrow III of FIG. 1.

FIG. 1 shows an overall plan view of the fixing device 10 of the exemplary embodiment, FIG. 2 shows an overall side view of the fixing device 10, and FIG. 3 shows an overall front view of the fixing device 10.

As shown in FIG. 1 to FIG. 3, the fixing device 10 fixes the printed board 20 in a two-folded state by folding a board flexible part 21 which constitutes the printed board 20.

The fixing device 10 is placed between one rigid printed board (simply referred to as one board hereinafter) 22 and the other rigid printed board (simply referred to as the other board hereinafter) 23 of the printed board 20, which are folded in two to be in parallel to each other, and the fixing device 10 is formed by including a coupling member 12 which couples and fixes the one and the other boards 22 and 23 to each other.

The length of the coupling member 12 is set to be within a range of the entire thickness including the one and the other boards 22 and 23 in a two-folded state.

As shown in FIG. 1, the coupling member 12 is provided at two points of the one and the other boards 22 and 23. A fixing pin 13 as a first coupling member out of the coupling members 12 provided at two points is provided on one end of a side where the flexible part 21 of the one and the other boards 22, 23 is located, i.e., at a first point A.

Further, a linear member as a second coupling member out of the coupling members 12 provided at two points is provided at the other end part that is on the opposite side of the side where the flexible part of the one and the other boards 22, 23 is placed, i.e., at a second point B. Further, this linear member is formed by a tin-plated wire having electric conductivity.

As shown in FIG. 2 and FIG. 3, the fixing pin 13 is formed in a shape which includes a pin main body 13A of a prescribed outer diameter, and a first pin header 13B as well as a second pin header 13C of a smaller diameter than the outer diameter of the pin main body 13A, which are provided at both ends of the pin main body 13A, respectively.

The first pin header 13B of the pin main body 13A is fitted into a fitting hole 22A opened on the one board 22 by being press-fitted, for example.

Further, the second pin header 13C of the pin main body 13A is also fitted into a fitting hole 23A opened on the other board 23 by being press-fitted, for example.

At this time, the length between the both ends of the first pin header 13B and the second pin header 13C is so set that each of the end faces is slightly recessed from the outer surface of each of the boards 22, 23 so as not to be extruded from the external surfaces of each of those boards 22, 23 as shown in FIG. 2. That is, as described above, it is set to be within a range of the thickness of the one and the other boards 22 and 23 in a two-folded state.

Note here that the both end faces of the pin main body 13A in the axial direction abut against the opposing faces of the one and the other boards 22 and 23. That is, the both ends of the first pin header 13B and the second pin header 13C of the pin main body 13A also work as a spacer for maintaining the space between each of the boards 22 and 23.

As shown in FIG. 2, the tin-plated wire 16 is formed substantially in a crank state when viewed from a side, and it is placed across between the one and the other opposing boards 22 and 23.

A lower horizontal end part of the tin-plated wire 16 is provided on the top face of the one board 22 via a first pad 17, and an upper horizontal end part of the tin-plated wire 16 is provided on the top face of the other board 23 via a second pad 18.

The first pad 17 and the second pad 18 are covered by a thin copper foil having electric conductivity, for example, and as shown in FIG. 1, the positions thereof are shifted by one pad, for example, in the longitudinal direction of the one and the other boards 22 and 23.

The first pad 17 is fixed to the top face of the one board 22 by soldering. Further, the second pad 18 is embedded in a recessed part 23B formed on the top face of the other board 23, and fixed to the board 23 by soldering.

Furthermore, the lower one end of the tin-plated wire 16 is fixed to the top face of the second pad 18 by soldering, and the upper one end is fixed to the top face of the first pad 17 by soldering.

As shown in FIG. 1, the tin-plated wire 16 is provided obliquely to be along a diagonal line of the first pad 17 and the second pad 18, and it is formed to be able to secure the length of the lower one and the upper one end to be in a length required for a soldering work. Thus, the soldering work for attaching the lower one end and upper one end of the tin-plated wiring 16 to the first pad 17 and the second pad 18, respectively, can be done easily.

Further, the depth of the recessed part 23B, the thickness of the second pad 18, and the diameter of the tin-plated wire 16 are so set in advance that the top face height of one end of the tin-plated wire 16 at least becomes equal to the top face height of the other board 23, more preferably, becomes lower than the top face height of the other board 23 when the upper horizontal one end of the tin-plated wire 16 is fixed to the top face of the second pad 18.

The second pad 18 may be directly attached to the top face of the board 23 and the upper horizontal one end of the tin-plated wire 16 may be attached thereon without forming the recessed part 23B on the top face of the other board 23. This also makes it possible to achieve the exemplary object of the present invention, since the second pad 18 is extremely thin and the diameter of the tin-plated wire 16 is also small so that the influence upon reduction in the thickness of the device is small.

Further, the tin-plated wire 16 may only need to have a physical strength which can electrically connect the one and the other boards 22, 23 and can keep the coupling state of each of the boards 22, 23. Therefore, it is not limited to the case of using the tin-plated wire 16 as the linear member. For example, a copper wire may be used.

Since the tin-plated wire 16 exhibits the electric conductivity, the tin-plated wire 16 also functions as an earth in addition to coupling and fixing each of the boards 22, 23 when soldering the tin-plated wire 16 and each of the pads 17, 18. Further, the tin-plated wire is less expensive compared to the fixing pin 13 and the existing fixing bolt 53.

Figure 4:
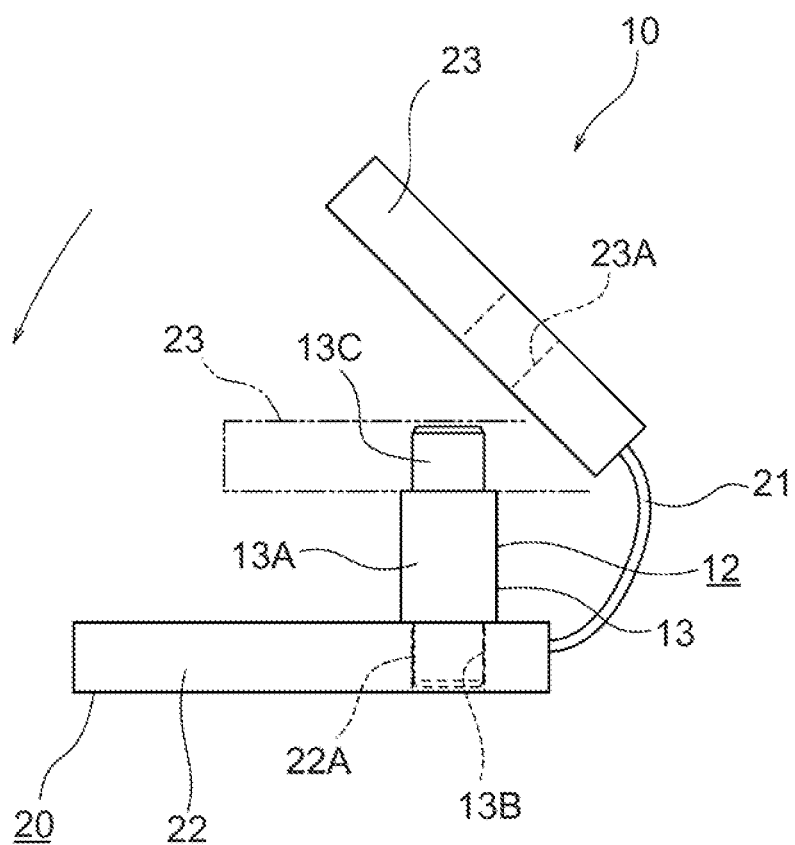
FIG. 4 is an illustration showing an action of assembling one and the other boards of the printed board fixing device of the exemplary embodiment.

Next, the procedure for coupling and fixing the printed board 20 in the above-described structure will be described by referring to FIG. 4.

At first, the first pin header 13B of the fixing pin 13 is fitted by press-fitting, for example, into the fitting hole 22A opened in a prescribed position of the one board 22.

Next, the board flexible part 21 is bent in such a manner that the other board 23 becomes in parallel to the one board 22. At the same time, the person working on this presses the other board 23 against the second pin header 13C to fit the fitting hole 23A opened in the other board 23 and the second pin header 13C of the fixing pin 13 while checking the positions of the fitting hole 23A and the second pin header 13C so as to fit the fitting hole 23A and the header 13C with each other by press-fitting, for example. Thereby, the one board 22 and the other board 23 are coupled and fixed to each other.

When the one board 22 and the other board 23 are coupled and fixed to each other by the fixing pin 13, the procedure is shifted to an attaching work of the tin-plated wire 16.

That is, the lower horizontal end of the tin-platted wire 16 is soldered to the first pad 17 that is provided in advance to the one board 22. Subsequently, the upper horizontal end of the tin-plated wire 16 is soldered to be in an oblique state to the second pad 18 that is provided in advance to the other board 23 so as to couple and fix the one board 22 and the other board 23.

The order of attaching the tin-plated wire 16 to each of the pads 17 and 18 may be inverted. That is, the upper horizontal end of the tin-plated wire 16 may be fixed to the other board 23 first, and the lower horizontal end may be fixed to the one board 22 thereafter.

Following effects can be achieved with the fixing device 10 formed in the structure described above.

(1) Since each of the lengths of the fixing pin 13 and the tin-plated wire 16 constituting the coupling member 12 is set to be within the range of the entire thickness including the one and the other boards 22 and 23, both ends of the fixing pin 13 and the tin-plated wire 16 are not projected to the outer side of each of the boards 22 and 23. As a result, it becomes possible to reduce the thickness and the size of the device with a simple structure.

(2) The coupling member 12 is formed with two members of the fixing pin 13 as the first coupling member provided at the first point A and the tin-plated wire 16 as the second coupling member provided at the second point B, and the fixing pin 13 and the tin-plated wire 16 are arranged in a well-balanced manner by being set on a diagonal of the one and the other boards 22 and 23. This makes it possible to achieve a stable coupling and fixing state.

(3) The fixing pin 13 includes the first pin header 13B and the second pin header 13C, and the first pin header 13B is press-fitted into the fitting hole 22A opened in the one board 22 and the second pin header 13C is press-fitted into the fitting hole 23A opened in the other board 23. Therefore, after the boards 22 and 23 are coupled and fixed to each other, those are not returned to the original uncoupled state. Thus, the coupled and fixed state of each of the boards 22 and 23 can be secured.

(4) The both end faces in the axial direction of the pin main body 13A which constitutes the fixing pin 13 are designed to abut against the opposing faces of the one and the other boards 22 and 23 which are in parallel to each other. Therefore, the fixing pin 13 can also function to keep the space between each of the boards 22 and 23.

(5) The fixing pin 13 simply needs to couple and fix the one and the other boards 22 and 23. Thus, through forming the pin main body 13A, the first pin header 13B, and the second pin header 13C to be in the minimum necessary size, it is possible to suppress reduction of the component mounting area in each of the boards 22 and 23.

(6) The first pad 17 and the second pad 18 are arranged on the one and the other boards 22 and 23 by being shifted for one pad and the tin-plated wire 16 is provided obliquely to be along the diagonal line of each of the pads 17 and 18, the length of the lower horizontal end and the upper horizontal end can be secured to be in the length required for the soldering work. This makes it easy to perform the soldering work for attaching the lower and upper ends of the tin-plated wire 16 to the first pad 17 and the second pad 18, respectively.

The printed board fixing device according to the present invention is structured in the manner described above. According to this, as an exemplary advantage according to the invention, the length of the coupling member is set to be within the range of the entire thickness including the one and the other rigid printed boards, so that both ends of the coupling member are not extruded towards the outer side of the one and the other rigid printed boards. As a result, it becomes possible to reduce the thickness and size with a simple structure.

While the present invention has been described by referring to the exemplary embodiment, the present invention is not limited only to the exemplary embodiment. Various changes and modifications occurred to those skilled in the art can be applied to the structures and details of the present invention. Further, it is to be understood that the present invention includes combinations of a part of or a whole part of the structures of the exemplary embodiment.

For example, in the exemplary embodiment, the fixing pin 13 is placed on the one end side of the longitudinal direction of the one and the other boards 22, 23, which is the end of the side where the flexible part 21 is provided, and the tin-plated wire 16 is placed on the other end side of the longitudinal direction of each of the boards 22, 23. However, the layout of the fixing pin 13 and the tin-plated wire 16 may be inverted therefrom in the longitudinal direction of each of the boards 22 and 23.

That is, in FIG. 1, the fixing pin 13 may be placed on the other end side of the longitudinal direction of one and the other boards 22, 23, and the tin-plated wire 16 may be placed on one end side of the longitudinal direction of each of the boards 22, 23. Even with such structure, it is also possible to achieve the same effects as those described in (1) to (6).

Figure 5:
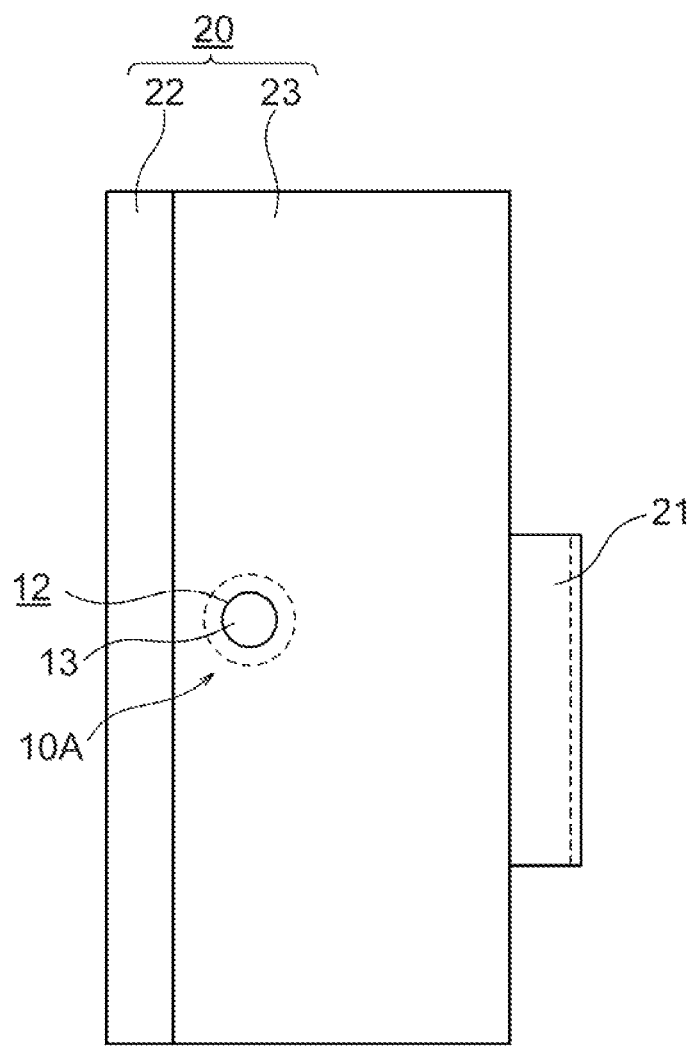
FIG. 5 is an overall plan view showing a modification example of the printed board fixing device according to the present invention.

Further, while the boards are coupled and fixed at two points in the exemplary embodiment, i.e., at the fixing pin 13 part and the tin-plated wire 16 part, the present invention is not limited only to that. As shown in FIG. 5, it is also possible to employ a fixing device 10A which includes a coupling/fixing structure formed only with the fixing pin 13.

In that case, the fixing pin 13 is provided substantially in the center part of the longitudinal direction of the one and the other boards 22, 23 and at the end on the opposite side of the end of the side where the flexible part 21 is provided in the width direction of each of the boards 22, 23. With this, not only the substantially same effects as those described in (3) to (5) but also an effect described in (7) can be achieved.

(7) Each of the boards 22 and 23 is coupled and fixed only by the fixing pin 13, so that the tin-plated wire 16, the first pad 17, and the second pad 18 become unnecessary. Thus, the structure can be simplified. Further, the expense for the material thereof and for the processing work becomes unnecessary, so that the cost can be reduced.

(8) Since the fixing pin 13 is provided substantially in the center part in the longitudinal direction of the one and the other boards 22 and 23, it is possible to couple and fix the one and the other boards 22 and 23 in a well-balanced manner.

Figure 6:
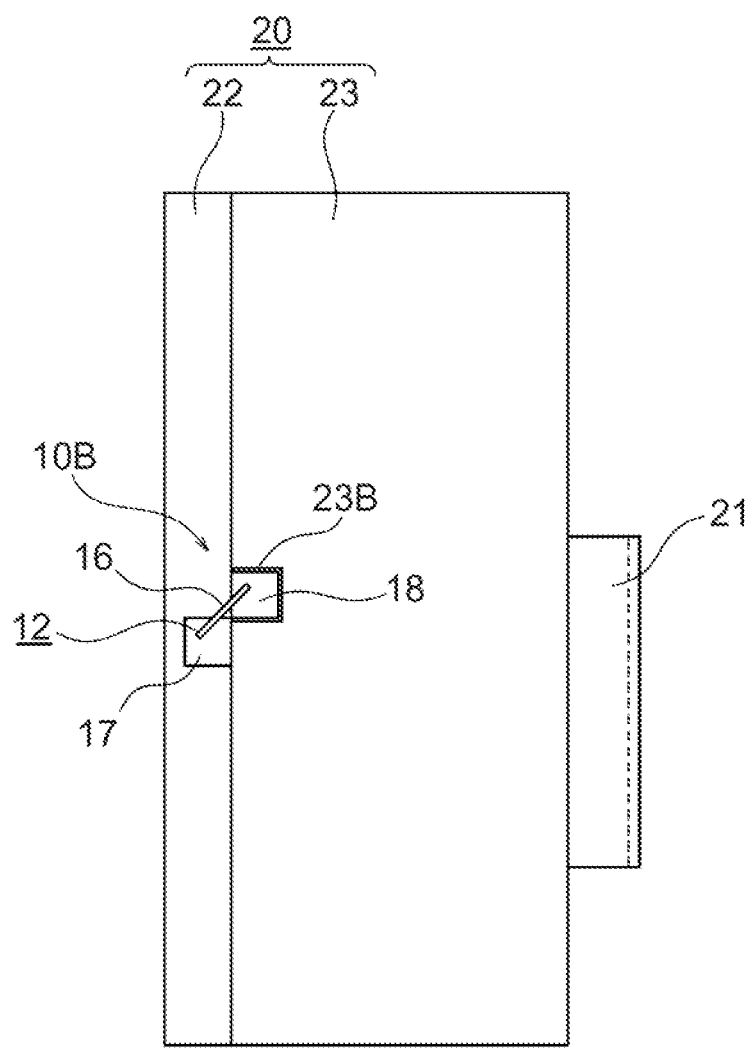
FIG. 6 is an overall plan view showing another modification example of the printed board fixing device according to the present invention.
Figure 7:
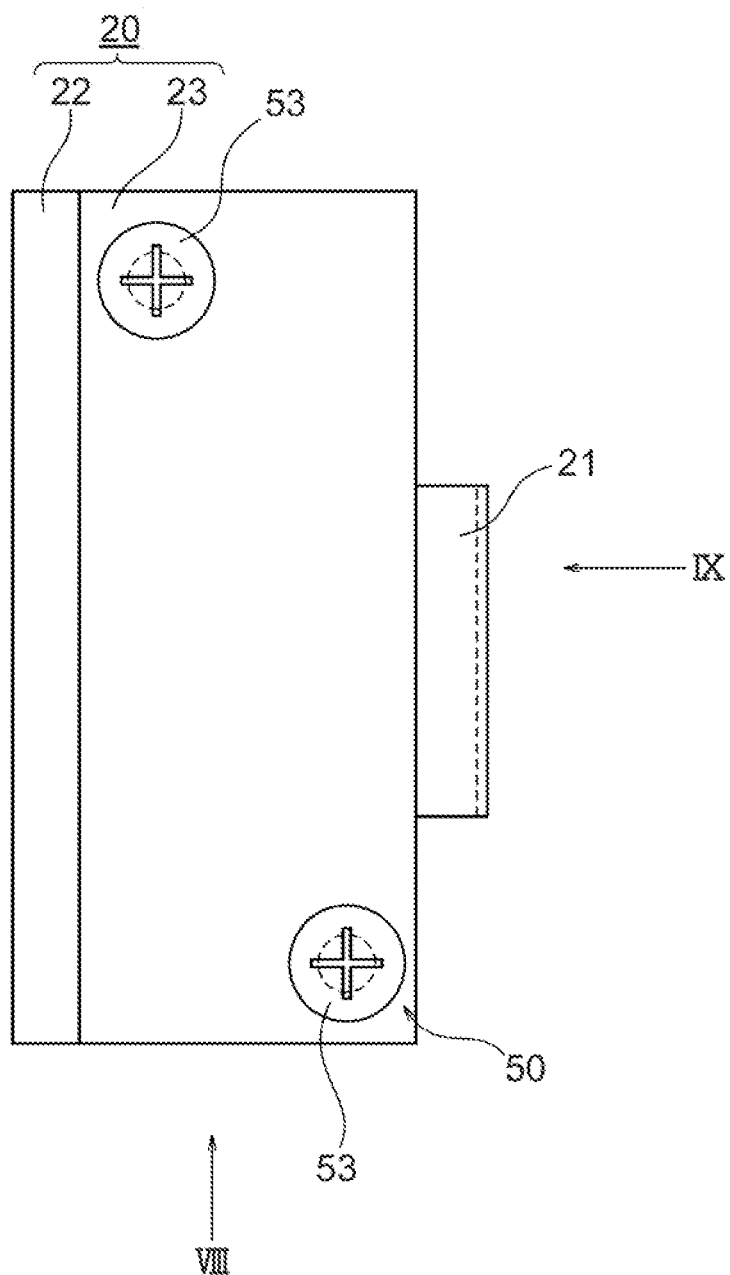
FIG. 7 is an overall plan view showing a related technique of the printed board fixing device.
Figure 8:
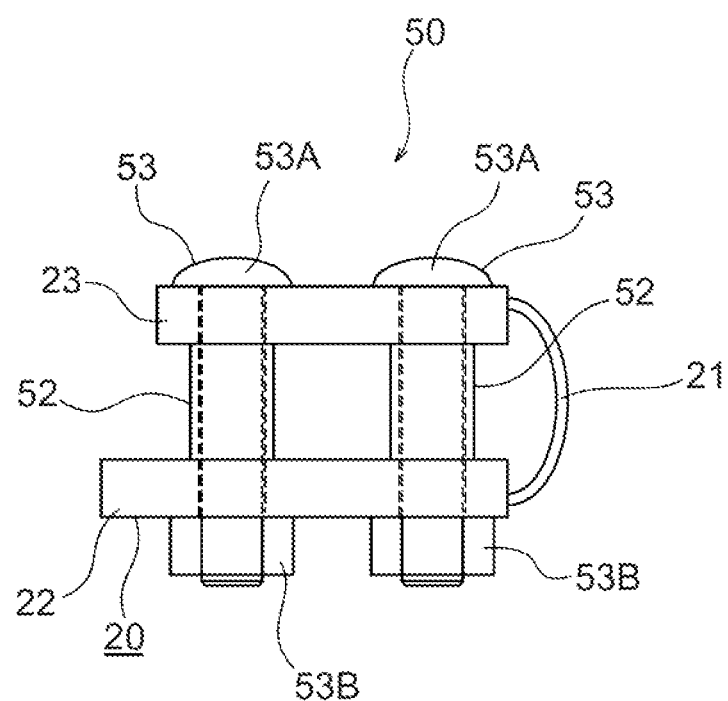
FIG. 8 is a view taken along an arrow VIII of FIG. 7.
Figure 9:
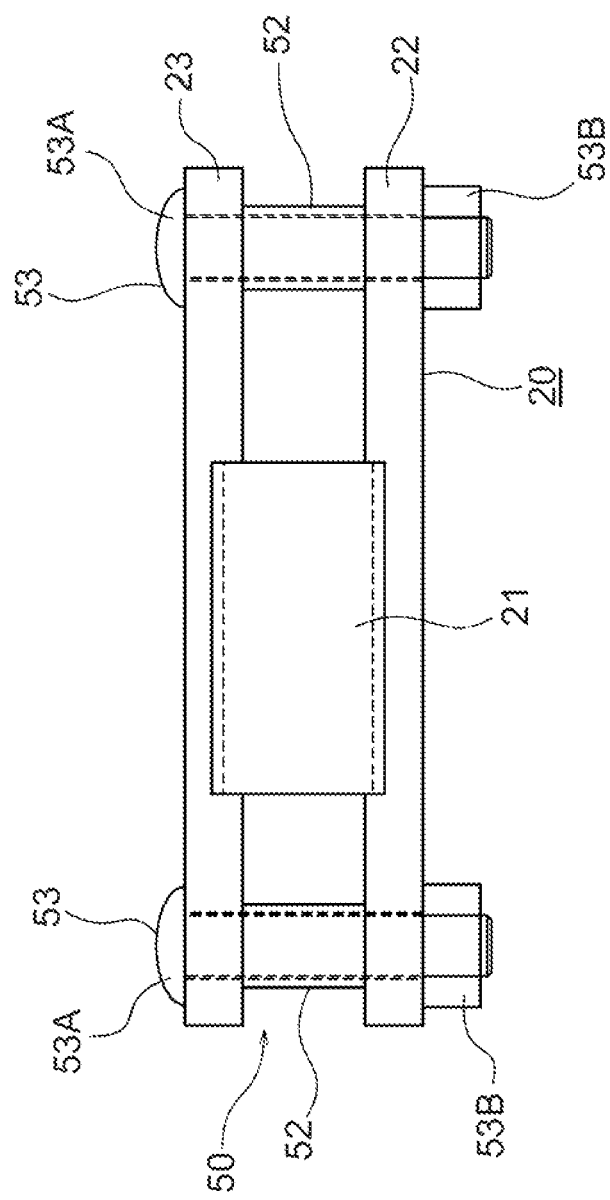
FIG. 9 is a view taken along an arrow IX of FIG. 7.

Further, while the boards are coupled and fixed at two points in the exemplary embodiment, i.e., at the fixing pin 13 part and the tin-plated wire 16 part, the present invention is not limited only to that. As shown in FIG. 6, it is also possible to employ a fixing device 10B which includes a coupling/fixing structure formed only with the tin-plated wire 16.

In that case, the tin-plated wire 16 is provided substantially in the center part of the longitudinal direction of the one and the other boards 22, 23 and at the end on the opposite side of the end of the side where the flexible part 21 is provided in the width direction of each of the boards 22, 23. Further, the tin-plated wire 16 is less expensive compared to the fixing pin 13 including the first pin header 13B and the second pin header 13C and compared to already-used bolts and nuts.

With this, not only the substantially same effects as those described in (6) and (8) but also an effect described in (9) can be achieved.

(9) Each of the boards 22 and 23 is coupled and fixed only by the tin-plated wire 16, so that the fixing pin 13 becomes unnecessary. Thus, the structure can be simplified. Further, the expense for the material thereof and for processing work becomes unnecessary, so that the cost can be reduced. Moreover, the tin-plated wire 16 can be made less expensively compared to the fixing pin 13 including the first pin header 13B and the second pin header 13C and compared to existing bolts and nuts.

Further, while the coupling members 12 are formed with the fixing pin 13 and the tin-plated wire 16, and the fixing pin 13 is placed at the first point A and the tin-plated wire 16 is placed at the second point B in the exemplary embodiment, the present invention is not limited only to that.

The fixing pin 13 may be placed at the first point A and the second point B, respectively. With this structure, it is also possible to achieve the same effects as those described in (1) to (6).

The whole or part of the exemplary embodiments disclosed above can be described as, but not limited to, the following supplementary notes:

Supplementary Note 1

A printed board fixing device which includes a coupling member which two-folds a flex rigid printed board including one and other rigid printed boards via a flexible part and mutually couples and fixes the one and the other boards, wherein length of the coupling member is set to be within a range of entire thickness including the one and the other rigid printed boards.

Supplementary Note 2

The printed board fixing device depicted in Supplementary Note 1, wherein the coupling member is provided at two points on the one and the other rigid printed boards.

Supplementary Note 3

The printed board fixing device depicted in Supplementary Note 2, wherein: a first coupling member out of the coupling members provided at the two points is provided at one end of a side where the flexible part of the one and the other printed boards is located; and a second coupling member out of the coupling members provided at the two points is provided on other end of an opposite side of the side where the flexible part of the one and the other printed boards is located.

Supplementary Note 4

The printed board fixing device depicted in Supplementary Note 2 or 3, wherein the coupling member provided at the first point is formed with a fixing pin which couples and fixes the one and the other rigid printed boards.

Supplementary Note 5

The printed board fixing device depicted in Supplementary Note 4, wherein the fixing pin is formed with: a pin main body which keeps a space between opposing faces of the one and the other rigid printed boards; one pin head formed on one end of the pin main body and fitted into a fitting hole opened on the one rigid printed board; and other pin head formed on other end of the pin main body and fitted into a fitting hole opened on the other rigid printed board.

Supplementary Note 6

The printed board fixing device depicted in Supplementary Note 2 or 3, wherein the coupling member provided at the second point is formed with a linear member that is provided across between the one and the other rigid printed boards.

Supplementary Note 7

The printed board fixing device depicted in Supplementary Note 6, wherein: the linear member is formed with a tin-plated wire, one end of the tin-plated wire is fixed to a top face of the one rigid printed board via an electric conductive pad, and other end of the tin-plated wire is fixed to a top face of the other rigid printed board via an electric conductive pad; and the electric conductive pad to which the other end of the tin-plated wire is fixed is embedded in a recessed part that is formed on the top face of the other board.

Supplementary Note 8

The printed board fixing device depicted in Supplementary Note 7, wherein: the electric conductive pad for the one end of the tin-plated wire provided on the top face of the one rigid printed board and the electric conductive pad for the other end of the tin-plated wire provided on the top face of the other board are provided by being shifted in a longitudinal direction of the one and the other boards; and the tin-plated wire is provided along a diagonal line across the electric conductive pad for the one end and the electric conductive pad for the other end.

INDUSTRIAL APPLICABILITY

The present invention can be utilized for a printed board fixing device when fixing and holding a single flex rigid printed board in a folded state used for information apparatuses, electronic apparatuses, etc.

What is claimed is:

1. A printed board fixing device, comprising a coupling member which two-folds a flex rigid printed board including one and other rigid printed boards via a flexible part and mutually couples and fixes the one and the other boards, wherein
    the coupling member is provided at two points on the one and the other rigid printed boards,
    a first coupling member out of the coupling members provided at the two points is provided at one end of a side where the flexible part of the one and the other printed boards is located; and
    a second coupling member out of the coupling members provided at the two points is provided on other end of an opposite side of the side where the flexible part of the one and the other printed boards is located,
    the coupling member provided at the first point is formed with a fixing pin which couples and fixes the one and the other rigid printed boards,
    the coupling member provided at the second point is formed with a tin-plated wire that is provided across between the one and the other rigid printed boards,
    each length of the first and second coupling members is set to be within a range of entire thickness including the one and the other rigid printed boards.

2. The printed board fixing device as claimed in claim 1, wherein
    the fixing pin is formed with: a pin main body which keeps a space between opposing faces of the one and the other rigid printed boards; one pin head formed on one end of the pin main body and fitted into a fitting hole opened on the one rigid printed board; and other pin head formed on other end of the pin main body and fitted into a fitting hole opened on the other rigid printed board.

3. The printed board fixing device as claimed in claim 2, wherein:
    one end of the tin-plated wire is fixed to a top face of the one rigid printed board via an electric conductive pad, and other end of the tin-plated wire is fixed to a top face of the other rigid printed board via an electric conductive pad; and
    the electric conductive pad to which the other end of the tin-plated wire is fixed is embedded in a recessed part that is formed on the top face of the other board.

4. The printed board fixing device as claimed in claim 3, wherein:
    the electric conductive pad for the one end of the tin-plated wire provided on the top face of the one rigid printed board and the electric conductive pad for the other end of the tin-plated wire provided on the top face of the other board are provided by being shifted in a longitudinal direction of the one and the other boards; and
    the tin-plated wire is provided along a diagonal line across the electric conductive pad for the one end and the electric conductive pad for the other end.

* * * * *